United States Patent [19]

Nyuji

[11] 4,335,374
[45] Jun. 15, 1982

[54] KEY DISCRIMINATION CIRCUIT

[75] Inventor: Tomoaki Nyuji, Hirakata, Japan

[73] Assignee: Matsushita Electric Industrial Co., Ltd., Kadoma, Japan

[21] Appl. No.: 157,834

[22] Filed: Jun. 9, 1980

Related U.S. Application Data

[63] Continuation-in-part of Ser. No. 964,438, Nov. 28, 1978, abandoned.

[30] Foreign Application Priority Data

Dec. 2, 1977 [JP] Japan ............................ 52-145234

[51] Int. Cl.$^3$ .............................................. G06F 3/02
[52] U.S. Cl. ................................ 340/365 S; 364/707
[58] Field of Search ............ 340/365 S, 365 E, 365 R, 340/166 R; 178/17 A, 17 C; 84/1.01; 179/90 K; 400/472, 479, 477; 364/707

[56] References Cited

U.S. PATENT DOCUMENTS 3,818,441 6/1974 Nomiya et al. ................. 340/365 E
3,900,845 8/1975 Tsuiki et al. .................... 340/365 E
4,138,916 2/1979 Kitagawa ............................ 84/1.01
4,138,917 2/1979 Sakashita et al. ............... 340/365 R
4,148,017 4/1979 Tomisawa ....................... 340/365 S

FOREIGN PATENT DOCUMENTS 2852558 12/1980 Fed. Rep. of Germany ... 340/365 S
1370654 10/1974 United Kingdom ............ 340/365 E
2012461 7/1979 United Kingdom ............ 340/365 S Primary Examiner—James J. Groody
Attorney, Agent, or Firm—Wenderoth, Lind & Ponack

[57] ABSTRACT

A key discrimination circuit for determining which key among a plurality of keys disposed in a matrix is actuated and which generates less electrical noise than prior art key discrimination circuits. In prior art key discrimination circuits, one set of lines forming the key matrix are continuously scanned while a plurality of AND gates are cyclically enabled thereby determining the actuated key or keys according to the time an output signal is generated. Because the continuously scanned set of lines are long and have "1" and "0" level signals periodically appearing thereon, they tend to generate electrical noise. In the key discrimination circuit of the present invention, initially all the lines in one set of lines have a "1" level applied thereto. A separate circuit determines when any key is actuated. Only when it is determined that at least one key is actuated is the key matrix scanned to determine the key or keys actuated. Therefore, the set of lines are intermittently scanned only when it is necessary to determine which key is actuated, thereby reducing the electrical noise generation.

2 Claims, 5 Drawing Figures

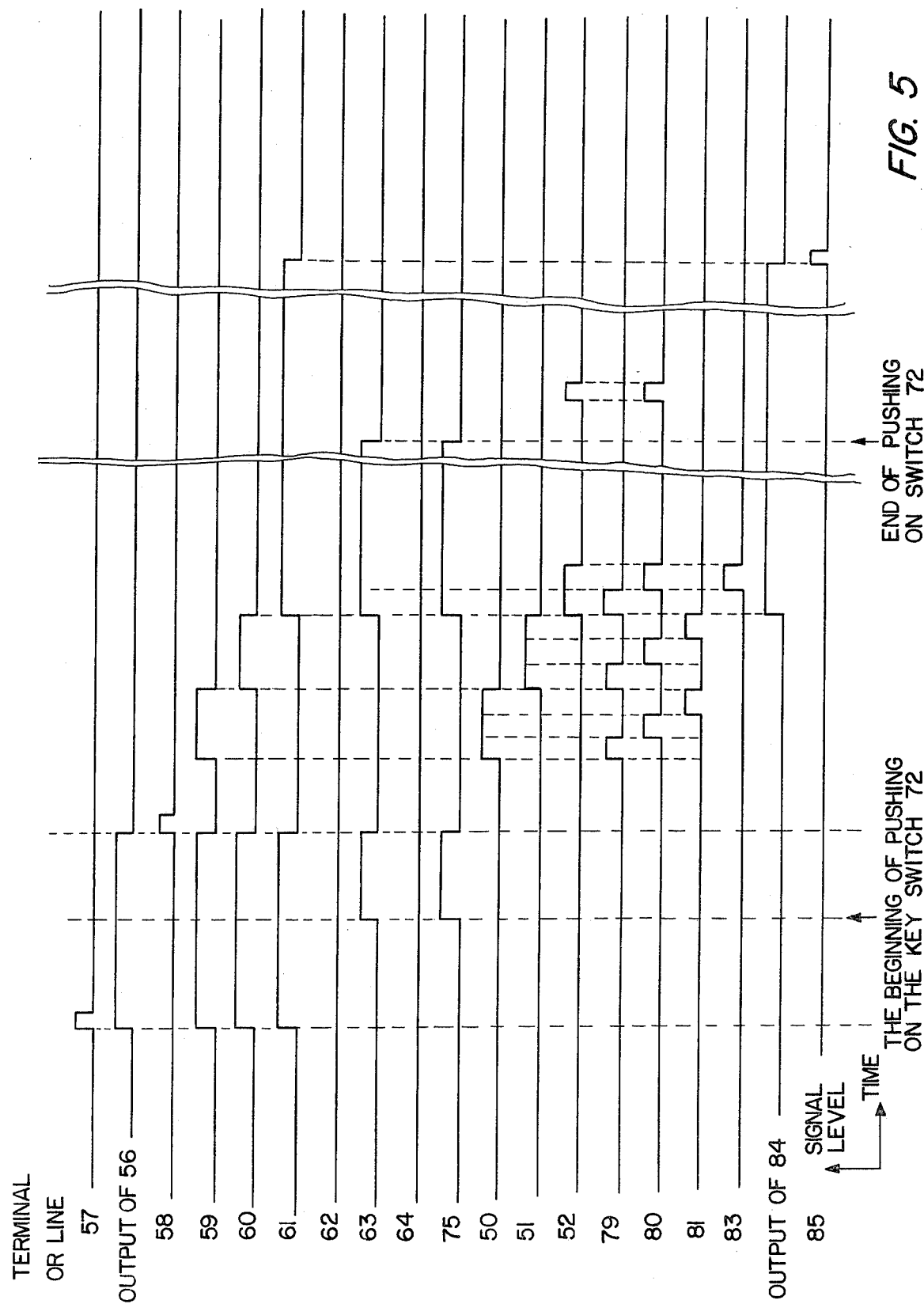

4,335,374

KEY DISCRIMINATION CIRCUIT

CROSS-REFERENCE TO RELATED APPLICATIONS

This application is a continuation-in-part of application Ser. No. 964,438, filed Nov. 28, 1978, and now abandoned.

BACKGROUND OF THE INVENTION

1. Field of the Invention

This invention relates to a key discrimination circuit which determines which key is pushed among keys laid on the crosspoints between two groups of signal lines, particularly, the invention relates to a key discrimination circuit having lower noise generation than that of prior art systems.

2. Description of the Prior Art

According to a conventional key discrimination circuit, as shown in FIG. 1, 9 key switches 7 to 15 are laid on the crosspoints between key input signal lines 1 to 3, which are connected to the 1st key discrimination signal input terminals 24 to 26, and key output signal lines 4 to 6, respectively, each of which is connected to one input terminal of a corresponding one of the 2-input AND gates 16 to 18. The other input terminal of each of the AND gates 16 to 18 is connected to the 2nd key discrimination signal input terminals 19 to 21, respectively. A scanning means 27 is connected to 1st key discrimination signal input terminals 24 to 26 and to 2nd key discrimination signal input terminals 19 to 21.

The outputs of the AND gates are connected to input terminals of a 3-input OR gate 22, the output terminal of which is connected to a key discrimination signal output terminal 23.

An exemplary method to determine a pushed or operated key or key switch in this conventional key discrimination circuit is described below. A cycle is repeated in which the 2nd key discrimination signal input terminals 19 to 21 have a "1" level pulse signal cyclically applied thereto from scanning means 27 when only line 1 among the key input signal lines 1 to 3 has a "1" level signal applied thereto from scanning means 27 and the other key input signal lines are held at a "0" level; then, the key discrimination signal input terminals 19 to 21 again have a "1" level pulse signal cyclically applied thereto from scanning means 27 when only line 2 among key input signal lines 1 to 3 has a "1" level signal applied thereto from scanning means 27 and the other key input signal lines are held at a "0" level; and lastly, the key discrimination signal input terminals 19 to 21 have a "1" level pulse signal cyclically applied thereto from scanning means 27 when only line 3 among key signal lines 1 to 3 has a "1" level signal applied thereto from scanning means 27 and the other key input signal lines are held at a "0" level. In such a procedure, the key among key switches 7 to 15 which is pushed is determined by judging which line among input signal lines 1 to 3 is held at a "1" level and which terminal among key discrimination signal input terminals 19 to 21 has a "1" level pulse signal applied thereto from scanning means 27 at that time. That is, by the simultaneous or synchronous supply of "1" level signals to a key input signal line and an input terminal of an AND gate by scanning means, the key switch corresponding to both is determined as operated key switch.

However, in such a conventional key discrimination circuit, key switches 7 to 15 laid on the crossing points among key input signal lines 1 to 3 and key output signal lines 4 to 6 and the circuit block containing the 1st key discrimination signal input terminals 24 to 26 and the 2-input AND gates 16 to 18 which are connected to the key output signal lines 4 to 6 are separated, so that the key input signal lines 1 to 3 and key output signal lines 4 to 6 are actually long lines connected between the keys and the circuit block. Key input signal lines 1 to 3 often generate noise to other circuit blocks when these key input signal lines 1 to 3 are driven by a pulse signal from scanning means 27, the pulse signal having a "1" level and a "0" level in turn. For example, if an FM/AM radio broadcasting receiver is set adjacent to this key discrimination circuit, the reception of FM/AM radio broadcasting receiver is disturbed by this noise.

SUMMARY OF THE INVENTION

Accordingly, it is a principal object of the present invention to provide an improved key discrimination circuit which generates less noise than prior art systems.

According to the present invention, the key discrimination circuit does not directly determine the pushed key, but first detects the fact that at least one key is pushed, and secondly determines which key is pushed. By separating the operation into two parts, key input signal lines are not always driven by a pulse signal which generates noise to other circuit blocks. More specifically, the key discrimination circuit of the present invention comprises:

key input signal lines and key output signal lines being mutually crossed in a matrix;

key switches each coupled to a corresponding one of said key input signal lines and a corresponding one of said key output signal lines for manually switching an electrical connection between the corresponding key input signal line and the corresponding key output signal line;

1st OR gates each having an output terminal coupled to a corresponding key input signal line and also having two input terminals, one input terminal of which is a 1st key discrimination signal input terminal for receiving a 1st key discrimination signal of "1" or "0";

an R-S flip-flop having an output terminal coupled to the other input terminal of each of the 1st OR gates, and having a reset terminal and a set terminal each for receiving a 2nd key discrimination signal of "1" or "0";

a 2nd OR gate having input terminals coupled to each of the key output signal lines for producing an output signal "1" when one of the key switches is manually operated to connect the corresponding key input signal line and the corresponding key output signal line, and for producing an output signal "0" when none of the key switches is manually operated;

AND gates each having an output terminal and each having two input terminals, one input terminal of which is coupled to a corresponding one of the key output signal lines, and the other input terminal of which is a 3rd key discrimination signal input terminal for receiving a 3rd key discrimination signal of "1" or "0", the output signal of the 2nd OR gate being used for enabling the application of the 2nd key discrimination signal to the reset terminal of the R-S flip-flop, and for enabling the 1st key discrimination signal to be applied to each of the 1st OR gates and for enabling the the application of the 3rd key discrimination signal to each of the AND gates;

and a 3rd OR gate having input terminals coupled to the output terminals of the AND gates, respectively, for producing at the output terminal thereof, a key discrimination output signal "1" which is in synchronism with the simultaneous application of the 1st key discrimination signal "1" and the 3rd key discrimination signal "1" for application to one of the 1st OR gates and one of the AND gates corresponding to the operated key switch; this key discrimination output signal is also used for enabling the application of the 2nd key discrimination signal to the set terminal of the R-S flip-flop, whereby when one of the key switches is manually operated, a "1" signal from the R-S flip-flop in its set state is transferred to the 2nd OR gate through the operated key switch; then, by means of the output signal "1" of the 2nd OR gate the R-S flip-flop is brought to its reset state, and a scanning signal of alternate "1" and "0" signals is applied to the 1st key discrimination signal input terminals and the 3rd key discrimination signal input terminals; then, in synchronism with of the "1" signal at the 1st key discrimination signal input terminal and the 3rd key discrimination signal input terminal corresponding to the operated key switch, a key discrimination output signal "1" at the output terminal of the 3rd OR gate is produced thereby determining the operated key switch; and then, the "1" signal from the 3rd OR gate sets the R-S flip-flop.

According to a further development of the present invention, the key discrimination circuit further comprises a further R-S flip-flop having its set terminal connected to the 1st key discrimination signal input terminal of one of the 1st OR gates for receiving the 1st key discrimination signal, and also having a reset terminal to which the key discrimination output signal "1" applied to its reset terminal after the determination of the operated key switch, whereby when the operated key switch is coupled to the key signal input line corresponding to this further R-S flip-flop, pulse noise due to the repeated application of the "1" signal to the 1st key discrimination signal input terminal corresponding to the operated key switch can be suppressed.

BRIEF DESCRIPTION OF THE DRAWING

Further objects and features of the present invention will be apparent from the following description taken together with the accompanying drawings, wherein:

FIG. 5 is a timing diagram common to FIG. 3 and FIG. 4, for showing the timing relationship of signals appearing at various points of the circuit of FIG. 3 or FIG. 4.

Referring to FIG. 2, reference numerals 50, 51 and 52 designate first key discrimination signal input terminals for receiving the 1st key discrimination signal. Reference numerals 53, 54 and 55 designate the 1st 2-input OR gates, one input terminal of each of which is connected to one of the first key discrimination signal input terminals 50, 51 and 52, respectively. Reference numeral 56 designates a 1st R-S flip-flop, an output terminal of which is connected in common to the other input terminal of each of the 1st 2-input OR gates. Reference numerals 57 and 58 designate the 2nd key discrimination signal input terminals, which are connected to the reset terminal and the set terminal of 1st R-S flip-flop 56, respectively.

Figure 1:
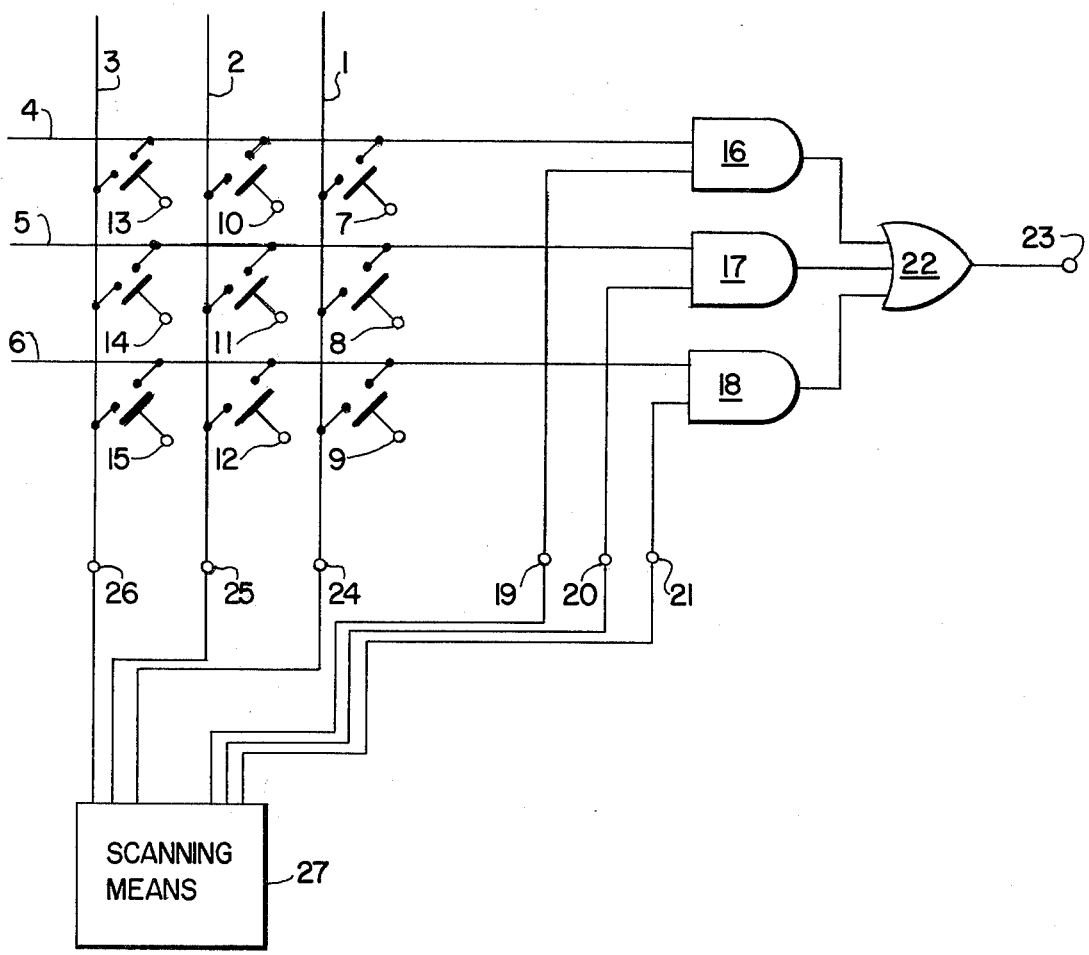
FIG. 1 is a schematic circuit diagram, in block form, of a typical key discrimination circuit of the prior art.

Reference numerals 59, 60 and 61 designate key input signal lines, which are connected to output terminals of the 2-input OR gates, respectively. Reference numerals 62, 63 and 64 designate key output signal lines having 9 crosspoints in the matrix among the key input signal lines 59, 60 and 61. Reference numerals 65 to 73 designate key switches laid on these 9 crosspoints, tying the input signal lines 59, 60 and 61 to the output signal lines 62, 63 and 64. Reference numeral 74 designates the 2nd 3-input OR gate, input terminals of which are connected to the key output signal lines 62, 63 and 64. Reference numeral 75 designates a 1st key discrimination signal output terminal which is connected to the output terminal of the 2nd 3-input OR gate. Reference numerals 76, 77 and 78 designate 2-input AND gates, one input terminal of each of which is connected to one of the output signal lines 62, 63 and 64, respectively. Reference numerals 79, 80 and 81 designate 3rd key discrimination signal input terminals which are connected to the other input terminal of each of the 2-input AND gates 76, 77 and 78. Reference numeral 82 designates a 3rd 3-input OR gate which is connected to the output terminals of the 2-input AND gates, respectively. Reference numeral 83 designates a 2nd key discrimination signal output terminal which is connected to the output terminal of the 3rd 3-input OR gate 82.

Reference numeral 100 designates a 1st stage discrimination detector receiving an input signal from terminal 75 and generating output signals applied to terminal 58 of 1st R-S flip-flop 56 and to terminal 102. Reference numeral 101 designates a scanning means similar to scanning means 27 described in conjunction with the key discrimination circuit of the prior art illustrated in FIG. 1, except that scanning means 101 operates intermittently as described hereinbelow. Reference numeral 103 designates an output terminal of scanning means 101.

The input terminals of gates 74, 76, 77 and 78 are regarded equivalently as being at a "0" level when the input terminals are open. As this means, for example, each input terminal of the gates 74, 76, 77 and 78 has a register, one terminal of each of which is connected to the corresponding input terminal, and the other terminal of which is supplied with "0" level potential.

The operation of the above described example of the key discrimination circuit of the present invention will be explained in detail hereinafter with reference to FIG. 2.

When set and reset terminals 58 and 57 of RS flip-flop 56 are held at "0" level, the logic level of the output terminal of RS flip-flop 56 is unchanged; when the set terminal of flip-flop 56 is supplied with a "1" level from scanning means 101, the logic level of the output terminal is "1" and when reset terminal thereof is impressed with a "1" level from 1st stage discrimination detector, the logic level of the output terminal is "0". Next, the 1st stage of key discrimination is described below. When the 2nd key discrimination signal input terminal 57 which is connected to the set terminal of the 1st RS flip-flop 56 is supplied with a logic level "1" signal from scanning means 101, and the 2nd key discrimination signal input terminal 58 which is connected to the reset terminal of the 1st RS flip-flop 56 is supplied with a logic level "0" signal from the 1st stage discrimination detector, the output terminal of RS flip-flop 56 has a "1" level output.

Therefore, the output terminals of the 1st 2-input OR gates 53, 54 and 55, and key input signal lines 59, 60 and 61 also have a "1" level signal. Under the above described condition and when the key switches 65 to 73 are not pushed, the logic levels of key output signal lines 62, 63 and 64 are "0" levels, and so the 1st key discrimination signal output 75 is held at a "0" level. But, if at least one of the key switches 65 to 73 is pushed, the corresponding one of key output signal lines 62, 63 and 64 is brought to a "1" level, and the 1st key discrimination signal output 75 is also brought to a "1" level. If the 1st key discrimination signal output 75 becomes a "1" level, the system has determined that at least one key has been pushed, although the system has not determined which key has been pushed.

Then, the 2nd key discrimination signal input terminal 58 which is connected to the reset terminal of the 1st R-S flip-flop 56 is supplied with a "1" level from 1st stage discrimination detector 100 and the 2nd key discrimination signal input terminal 57 which is connected to the set terminal of flip-flop 56 is supplied with a "0" level from scanning means 101, and as a result thereof, the output terminal of R-S flip-flop 56 has a "0" level thereon. The above described sequence describes the 1st stage of key discrimination.

After finishing the 1st stage of the key discrimination, the 2nd stage of the key discrimination starts. An example of the operation of scanning means 101 during the 2nd stage is explained hereinafter. Scanning means 101 is triggered into operation via terminal 102 from 1st stage discrimination detector 100 upon detection of a depressed key. Only one input terminal 50 from among the 1st key discrimination signal input terminals 50, 51 and 52 is supplied with a "1" level from scanning means 101, and other input terminals are held at a "0" level, while each input terminal from among the 3rd key discrimination input terminals 79, 80 and 81 is cyclically supplied with a "1" level pulse signal from scanning means 101. Next, only the input terminal 51 from among input terminals 50, 51 and 52 is supplied with a "1" level from scanning means 101, while each terminal from among the 3rd key discrimination input terminals 79, 80 and 81 is cyclically supplied with a "1" level pulse signal from scanning means 101. Similarly, only the input terminal 52 is subsequently supplied with a "1" level from scanning means 101, while each terminal from among the 3rd key discrimination input terminals 79, 80 and 81 is cyclically supplied with a "1" level pulse signal from scanning means 101. This sequence (the scanning application of "1" signals) describes the 2nd stage of key discrimination. The determination of the pushed key is effected by examining the logic levels of the 1st discrimination signal inputs 50, 51 and 52 and the 3rd key discrimination signal input terminals 79, 80 and 81 when the 2nd key discrimination signal output terminal 83 has a "1" level thereon. For example, when the key switch 72 is pushed, it can be determined by examination of FIG. 2 that the 2nd key discrimination signal output terminal 83 has a "1" level signal thereon only when key input signal line 61 has a "1" level and key output signal line 80 has a "1" level.

The operation of scanning means 101 is identical to the operation of scanning means 27 of FIG. 1 except that scanning means 27 operates continuously and scanning means 101 must be triggered into operation and once triggered, it scans the key switches as described above and then generates an additional "1" level pulse signal for application to 2nd key discrimination signal input terminal 57 for setting 1st R-S flip-flop 56 at the end of each scanning cycle. If one or more keys are still depressed, this fact is sensed by 2nd 3-input OR gate 74 which causes 1st stage discrimination detector 100 to supply a "1" level signal to 2nd key discrimination signal input terminal 58 for immediately resetting 1st R-S flip-flop 56. Thus 1st R-S flip-flop 56 is not permanently set until the state is reached in which no key is depressed. Once the system reaches the state in which no key is depressed, the system assumes its initial state and is ready to begin the sequence again upon the detection of the depression of any one of the key switches 65 to 73 by 2nd 3-input OR gate 74. Scanning means 101 produces an output signal indicative of the key or keys depressed on output terminal 103.

After the 1st stage and the 2nd stage of key discrimination, other operations which correspond to the determined key and which are not within the scope of this invention are performed in other circuit blocks in a conventional manner.

Under the above described procedure, key input signal lines 59, 60 and 61 are not always supplied with a "1" level pulse signal, and thus, much noise generated by the pulse signal in key input signal lines 59, 60 and 61 can be suppressed, such noise having a bad effect upon other circuits located in the neighborhood of key input signal lines 59, 60 and 61.

If the parts of the system other than the part having key switches 65 to 73 are contained in a single semiconductor circuit chip, the output terminals of 2-input OR gates 53 to 55 become the output terminals of this semiconductor circuit chip and are separated by the long lines of key input signal lines 59, 60 and 61 and key output signal lines 62, 63 and 64 from the part of the system having key switches 65 to 73; the decrease of the time of application of pulse signals on key input signal lines 59, 60 and 61 effectively contributes to the reduction of noise.

Figure 2:
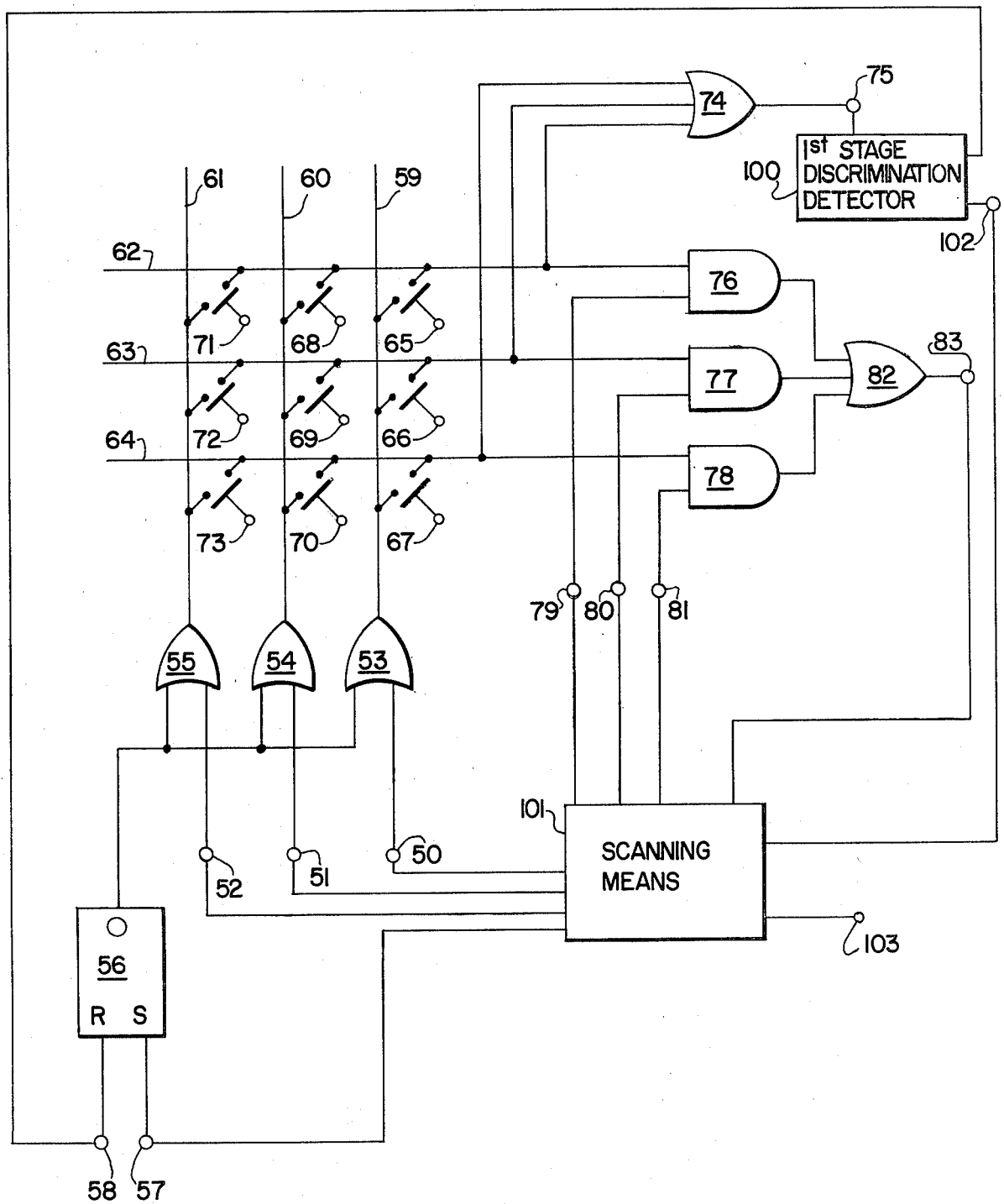
FIG. 2 is a schematic circuit diagram, in block form, of one embodiment of the key discrimination circuit of the present invention.
Figure 3:
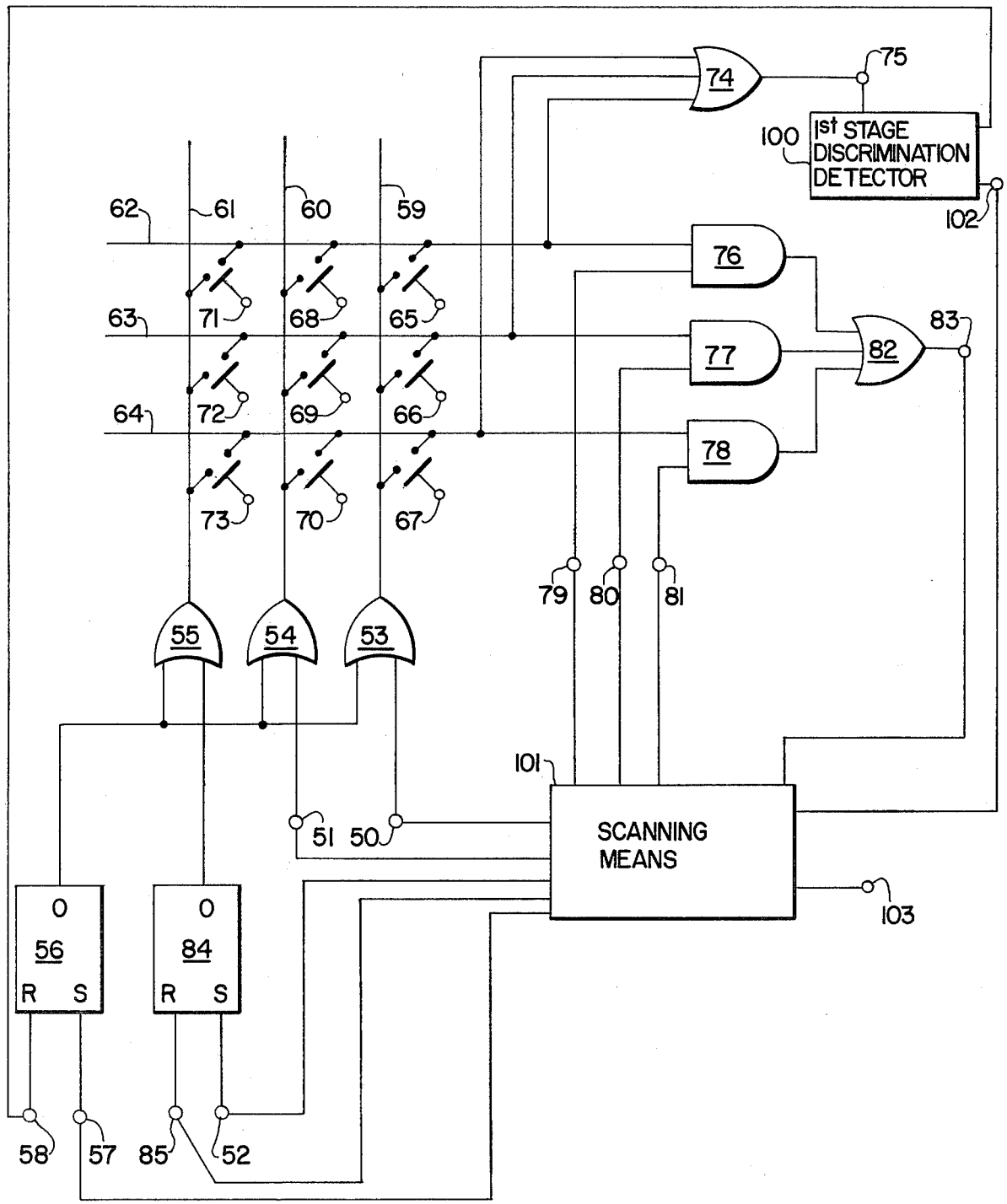
FIG. 3 is a schematic circuit diagram, in block form, of another embodiment of the key discrimination circuit of the present invention.

Referring to FIG. 3, there is illustrated another embodiment of a key discrimination circuit of this invention. Similar reference numerals in FIG. 3 designate components similar to those in FIG. 2.

Reference numeral 84 designates a 2nd R-S flip-flop, the set terminal of which is connected to the 1st key discrimination signal input terminal 52 and hence to scanning means 101 the output terminal of flip-flop 84 is connected to one input terminal of the 1st 2-input OR gate 55. Reference numeral 85 designates the 4th key discrimination signal input terminal, which is connected to the reset terminal of the 2nd R-S flip-flop 84 and to scanning means 101. The function of 2nd R-S flip-flop 84 is described hereinafter.

At first, let us consider the case when one of key switches 65, 66 and 67 is pushed. The 1st stage of key discrimination is the same as that which has been described with reference to FIG. 2. Next, the 2nd stage of key discrimination starts. The 1st key discrimination signal input terminals 50, 51 and 52 are sequentially scanned with a "1" level pulse signal from scanning means 101, while the same procedure as that described in FIG. 2 is used to determine which of key switches 65, 66 and 67 is pushed.

Because the R-S flip-flop 84 is provided, the 2nd step is not the same as that in the case of FIG. 2. The output terminal of R-S flip-flop 84 has a "1" level thereon when scanning means 101 applies a "1" level scanning signal to 1st key discrimination signal input 52, thereby setting the 2nd R-S flip-flop 84; the output terminal of flip-flop 84 holds this "1" level, even while the 1st key discrimination signal input terminal 52 cyclically supplies alternate "1" level and "0" level signals providing that a "0" level is applied to the 4th key discrimination signal input terminal 85 from scanning means 101.

Before another sequence of operation from the 1st stage to the 2nd stage (which is similar to the one described in FIG. 2) is started, the output terminal of the R-S flip-flop 84 must be set at the "0" level again by supplying the 4th key discrimination signal input terminal 85 with a "1" level from scanning means 101 and also by supplying the 1st key discrimination signal input terminal 52 with a "0" level from scanning means 101 after the occurrence of the determination output "1" at the terminal 83.

Next, let us consider the case when the flip-flop 84 operates effectively or when any one of key switches is pushed. The pushed key is determined through the 1st stage and the 2nd stage of key discrimination similar to those described in FIG. 2. However it is not the same as the case in FIG. 2 in that the output terminal of R-S flip-flop 84 is set at the "1" level by the application of a "1" level to 1st key discrimination signal input 52 from scanning means 101.

Next, let us consider the other operation corresponding to the key being determined from among key switches 71, 72 and 73. In such a case, it is often necessary to examine whether the determined key is still being pushed. In that case the 1st key discrimination signal input terminal 52 is supplied many times with a "1" level pulse signal and at the same time, each of the 3rd key discrimination signal input terminals 79, 80 and 81 is supplied many times with a "1" level. But, even if the 1st key discrimination signal input terminal 52 is supplied many times with a "1" level pulse signal, the output terminal of R-S flip-flop 84 always remains at a "1" level, so that a pulse signal is not applied to the key input signal line 61. Accordingly, pulse noise is thereby suppressed. Before switching again to the 1st stage of key discrimination where it is determined which one of the key switches 65 to 73 is pushed, the R-S flip-flop 84 must have a "1" level applied to its reset terminal from scanning means 101 and a "0" level applied to its set terminal from scanning means 101, so that the output of the R-S flip-flop 84 is re-set to a "0" level. Of course 1st R-S flip-flop 56 is reset from scanning means 101 in the same manner as described in conjunction with the embodiment illustrated in FIG. 2.

According to FIG. 3, the generation of alternate pulse signals of a "1" level and a "0" level on key input signal line 61 (while it is examined many times successively to indicate whether the determined key is still being pushed) can be prevented, so that the pulse noise can be suppressed, as set forth above.

In the above described embodiment of FIG. 3, the 2nd R-S flip-flop 84 is arranged to be coupled to the OR gate 55, but other R-S flip-flops may also be arranged to be coupled to other OR gates 53 and 54, respectively, and may be selectively reset from scanning means 101 in the same manner as 2nd R-S flip-flop 84 is reset.

In the conventional key discrimination circuit, key switches are determined individually at once, but this invention separates the key discrimination procedure into two stages, and the 1st stage is to detect when any one of keys is pushed, and the 2nd stage is the determination of the pushed key. As a result, the generation of pulse noise signals in key input signal lines can be prevented beforehand, such noise signals having a bad effect on other circuits.

Figure 4:
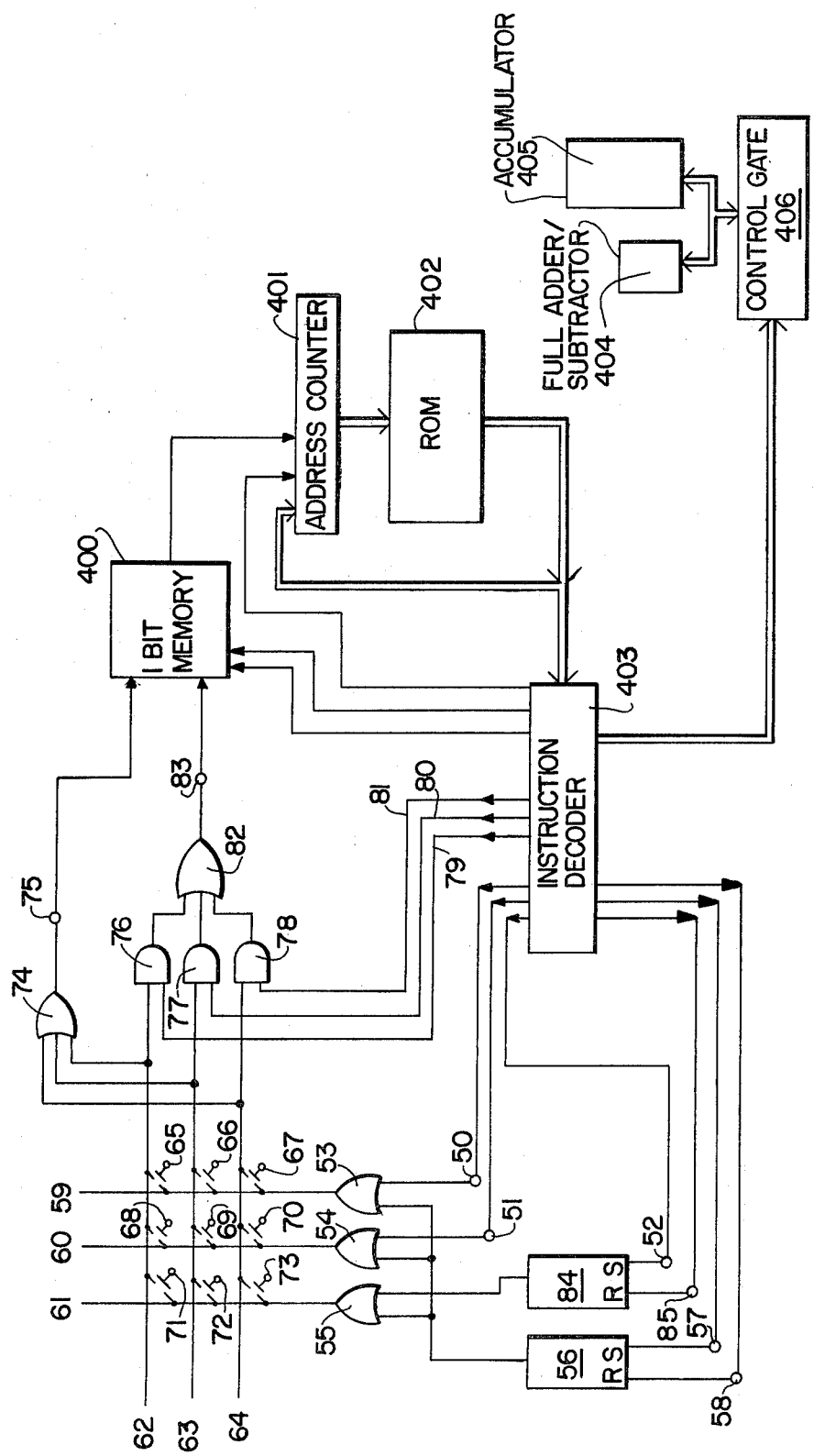
FIG. 4 is a schematic circuit diagram, in block form, of a specific example of the key discrimination circuit corresponding to FIG. 3, showing in detail an example of one arrangement of the combination of the scanning means and the 1st stage discrimination detector.

FIG. 4 shows an example of an arrangement of the combination of the scanning means and the 1st stage discrimination detector using a stored-program type circuit. FIG. 4 corresponds to FIG. 3, but it is a matter of course that a similar stored-program type circuit corresponding to FIG. 2 can be easily designed.

Referring to FIG. 4, command signals (instruction signals) are stored in ROM 402. They are sequentially read out and decoded by instruction decoder 403 for producing various control command signals. Reference numeral 401 is an address counter for ROM 402. The address contents can be discontinuously skipped (jumped) owing to the contents of a 1-bit memory 400. These elements 400, 401, 402 and 403 constitute the combination of the 1st stage discrimination detector and the scanning means.

The reset and set operations of the R-S flip-flop 56 and 84 are effected by command signals stored in the ROM 402. The scanning signals 79, 80, 81 and 50, 51 and 52 are also produced by command signals stored in ROM 402.

The 1st stage discrimination operation and the shifting operation from the 1st stage to 2nd stage (when the output signal at the terminal 75 is read) are also effected by using the discontinuous skipping (jumping) mechanism of the 1-bit memory 400 and the address counter 401, actuated by the command signals stored in ROM 402.

The discrimination operation (to discriminate which keyswitch has been pushed) and various operation (appointed in correspondence to the pushed keyswitch) are effected by elements 404, 405 and 406 which are controlled by command signals stored in ROM 402 through decoder 403.

FIG. 5 is a timing diagram common to FIG. 3 and FIG. 4, for showing the timing of signals appearing at various points of the circuit of FIG. 3 or FIG. 4.

As many apparently widely different embodiments of this invention may be made without departing from the spirit and scope thereof, it is to be understood that the invention is not limited to the specific embodiments herein described except as defined in the appended claims.

What is claimed is:

1. A key discrimination circuit comprising:
  a plurality of key input signal lines;
  a plurality of key output signal lines mutually crossed with said plurality of key input signal lines in a matrix;
  a plurality of key switches each coupled to a corresponding one of said key input signal lines and to a corresponding one of said key output signal lines for manually switching an electrical connection between said corresponding key input signal lines and said corresponding key output signal lines;
  a plurality of first OR gates, each having an output terminal connected to a corresponding one of said key input signal lines, a first input terminal and a second input terminal;

a R-S flip-flop having an output terminal connected to said first input terminal of each of said first OR gates, a set terminal and a reset terminal;

a second OR gate, having a plurality of input terminals each connected to a corresponding one of said key output signal lines and an output terminal, for producing an output signal "1" at said output terminal when one of said key switches is manually operated to connect said corresponding key input signal line and said corresponding key output signal line, and for producing an output signal "0" at said output terminal when none of said key switches is manually operated;

a plurality of AND gates, each having a first input terminal connected to a corresponding one of said key output signal lines, a second input terminal and an output terminal;

a third OR gate having a plurality of input terminals, each connected to said output terminal of a corresponding one of said AND gates, and an output terminal;

a first stage discrimination detector connected to said output terminal of said second OR gate and said reset terminal of said R-S flip-flop and having a trigger output terminal, for resetting said R-S flip-flop and for generating a trigger signal at said trigger output terminal when said second OR gate produces an output signal "1" at said output terminal thereof; and a scanning means connected to said second input terminals of said plurality of first OR gates, said set terminal of said R-S flip-flop, said second input terminals of said plurality of AND gates, said output terminal of said third OR gate, and said trigger output terminal of said first stage discrimination detector, and having an output terminal, for scanning said plurality of key switches by application of a "1" level pulse signal to successive ones of said second input terminals of said plurality of first OR gates for a predetermined period, during which period said scanning means further applies a "1" level signal to each of said second input terminals of said plurality of AND gates successively in turn, and thereafter applying a "1" level pulse signal to said set terminal of said R-S flip-flop when said first stage discrimination detector generates said trigger signal and for generating an output signal at said output terminal of said scanning means indicative of the key switches among said plurality of key switches manually switched from the time of generation of a "1" level signal at said output terminal of said third OR gate relative to said scan of said plurality of key switches.

2. A key discrimination circuit as claimed in claim 1, wherein:

at least one of said connections between said scanning means and said second terminals of said plurality of first OR gates comprises a further R-S flip-flop having an output terminal connected to said second input terminal of one of said plurality of first OR gates, a set input terminal connected to said scanning means and a reset terminal; and said scanning means further comprises a further R-S flip-flop reset output terminal connected to said reset terminal of said further R-S flip-flop for resetting said further R-S flip-flop by application of a "1" level pulse signal to said reset terminal of said further R-S flip-flop upon determination that a key switch corresponding to said key input signal line connected to one of said plurality of first OR gates connected to said further R-S flip-flop is not manually switched.

* * * * *